United States Patent
Zaynoun et al.

(10) Patent No.: US 11,011,459 B1
(45) Date of Patent: May 18, 2021

(54) BACK-END-OF-LINE (BEOL) ON-CHIP SENSOR

(71) Applicant: QUALCOMM Incorporated, San Diego, CA (US)

(72) Inventors: Samy Shafik Tawfik Zaynoun, San Diego, CA (US); David Kidd, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 16/784,054

(22) Filed: Feb. 6, 2020

(51) Int. Cl.
*H01L 23/498* (2006.01)
*H01L 23/00* (2006.01)

(52) U.S. Cl.
CPC ........ *H01L 23/49838* (2013.01); *H01L 24/05* (2013.01)

(58) Field of Classification Search
CPC ................................. H01L 23/49838
See application file for complete search history.

(56) References Cited

U.S. PATENT DOCUMENTS

| | | | | |
|---|---|---|---|---|
| 7,439,570 | B2 * | 10/2008 | Anthony | H01L 23/5223 257/309 |
| 8,759,893 | B2 * | 6/2014 | Cho | H01L 23/5223 257/308 |
| 9,406,604 | B2 * | 8/2016 | Cho | H01F 27/2885 |
| 10,060,817 | B2 * | 8/2018 | Nackaerts | G01L 9/0073 |
| 10,700,551 | B2 * | 6/2020 | Jacobson | H02J 50/10 |
| 2002/0084509 | A1 * | 7/2002 | Ballantine | H01L 23/5227 257/531 |
| 2002/0109204 | A1 * | 8/2002 | Acosta | H01F 17/0006 257/531 |
| 2004/0145033 | A1 * | 7/2004 | McElvain | G06F 30/394 257/659 |
| 2005/0034885 | A1 * | 2/2005 | Groves | H01L 23/5227 174/350 |
| 2006/0249850 | A1 * | 11/2006 | Erturk | H01L 23/5225 257/775 |
| 2007/0278551 | A1 * | 12/2007 | Anthony | H01L 23/5225 257/307 |
| 2010/0191236 | A1 * | 7/2010 | Johnson | A61N 1/05 606/41 |
| 2010/0265011 | A1 * | 10/2010 | Ding | H01P 1/203 333/204 |
| 2013/0093045 | A1 * | 4/2013 | Cho | H01L 21/02 257/531 |
| 2013/0314071 | A1 * | 11/2013 | Marriott | H01F 27/42 323/357 |
| 2013/0328142 | A1 * | 12/2013 | Nackaerts | H01L 29/84 257/415 |
| 2014/0159854 | A1 * | 6/2014 | Samala | H01F 17/0006 336/840 |

(Continued)

*Primary Examiner* — William A Harriston
(74) *Attorney, Agent, or Firm* — Seyfarth Shaw LLP

(57) ABSTRACT

An integrated circuit (IC), including a substrate and back-end-of-line (BEOL) layers on the substrate is described. The IC includes a sensor in a BEOL layer (Mx) of the BEOL layers. The BEOL sensor includes conductive traces and shield traces interdigitated with the conductive traces in the BEOL layer Mx. The BEOL sensor also includes a first ground shield in a BEOL layer Mx−1, and a second ground shield in a BEOL layer Mx+1. The BEOL sensor further includes logic configured to ground/float the shield traces.

20 Claims, 10 Drawing Sheets

(56) References Cited

U.S. PATENT DOCUMENTS

| | | | |
|---|---|---|---|
| 2016/0115014 A1* | 4/2016 | Van Kampen | H01G 5/38 257/532 |
| 2018/0190584 A1* | 7/2018 | Upadhyaya | H01L 23/5227 |
| 2018/0366822 A1* | 12/2018 | Cheng | H01Q 1/526 |

* cited by examiner

BACK-END-OF-LINE (BEOL) ON-CHIP SENSOR

BACKGROUND

Field

Aspects of the present disclosure relate to semiconductor devices and, more particularly, to a back-end-of-line (BEOL) on-chip sensor.

Background

Electrical connections exist at each level of a system hierarchy. This system hierarchy includes interconnection of active devices at a lowest system level all the way up to system level interconnections at the highest level. For example, interconnect layers can connect different devices together on an integrated circuit. As integrated circuits become more complex, more interconnect layers are used to provide the electrical connections between the devices. More recently, the number of interconnect levels for circuitry has substantially increased due to the large number of devices that are now interconnected in a modern electronic device. The increased number of interconnect levels for supporting the increased number of devices involves more intricate processes.

The design of complex complementary metal oxide semiconductor (CMOS) system-on-chips (SoCs) may be affected by layer-to-layer interconnect variation. That is, a dynamic performance of complex CMOS SoCs may be detrimentally affected by layer-to-layer interconnect variation. CMOS SoC circuit design techniques that account for layer-to-layer interconnect variation are desired.

SUMMARY

An integrated circuit (IC), including a substrate and back-end-of-line (BEOL) layers on the substrate is described. The IC includes a sensor in a BEOL layer (Mx) of the BEOL layers. The BEOL sensor includes conductive traces and shield traces interdigitated with the conductive traces in the BEOL layer Mx. The BEOL sensor also includes a first ground shield in a BEOL layer Mx−1, and a second ground shield in a BEOL layer Mx+1. The BEOL sensor further includes logic configured to ground/float the shield traces.

A method for operating a back-end-of-line (BEOL) on-chip sensor is described. The method includes computing a first ratio between a frequency of an unloaded reference ring oscillator and a frequency of a variable wire-loaded ring oscillator in a ground shield state. The method also includes computing a second ratio between the frequency of the unloaded reference ring oscillator and a frequency of the variable wire-loaded ring oscillator in a floating shield state. The method further includes determining a BEOL layer-to-layer interconnect variation by comparing the first ratio to the second ratio. The method also includes setting a minimum voltage for a system-on-chip (SoC) according to the BEOL layer-to-layer interconnect variation.

An integrated circuit (IC), including means for supporting back-end-of-line (BEOL) layers is described. The IC includes a sensor in a BEOL layer (Mx) of the BEOL layers. The BEOL sensor includes conductive traces and shield traces interdigitated with the conductive traces in the BEOL layer Mx. The BEOL sensor also includes a first ground shield in a BEOL layer Mx−1, and a second ground shield in a BEOL layer Mx+1. The BEOL sensor further includes logic configured to ground/float the shield traces.

This has outlined, rather broadly, the features and technical advantages of the present disclosure in order that the detailed description that follows may be better understood. Additional features and advantages of the present disclosure will be described below. It should be appreciated by those skilled in the art that this present disclosure may be readily utilized as a basis for modifying or designing other structures for carrying out the same purposes of the present disclosure. It should also be realized by those skilled in the art that such equivalent constructions do not depart from the teachings of the present disclosure as set forth in the appended claims. The novel features, which are believed to be characteristic of the present disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Figure 1:
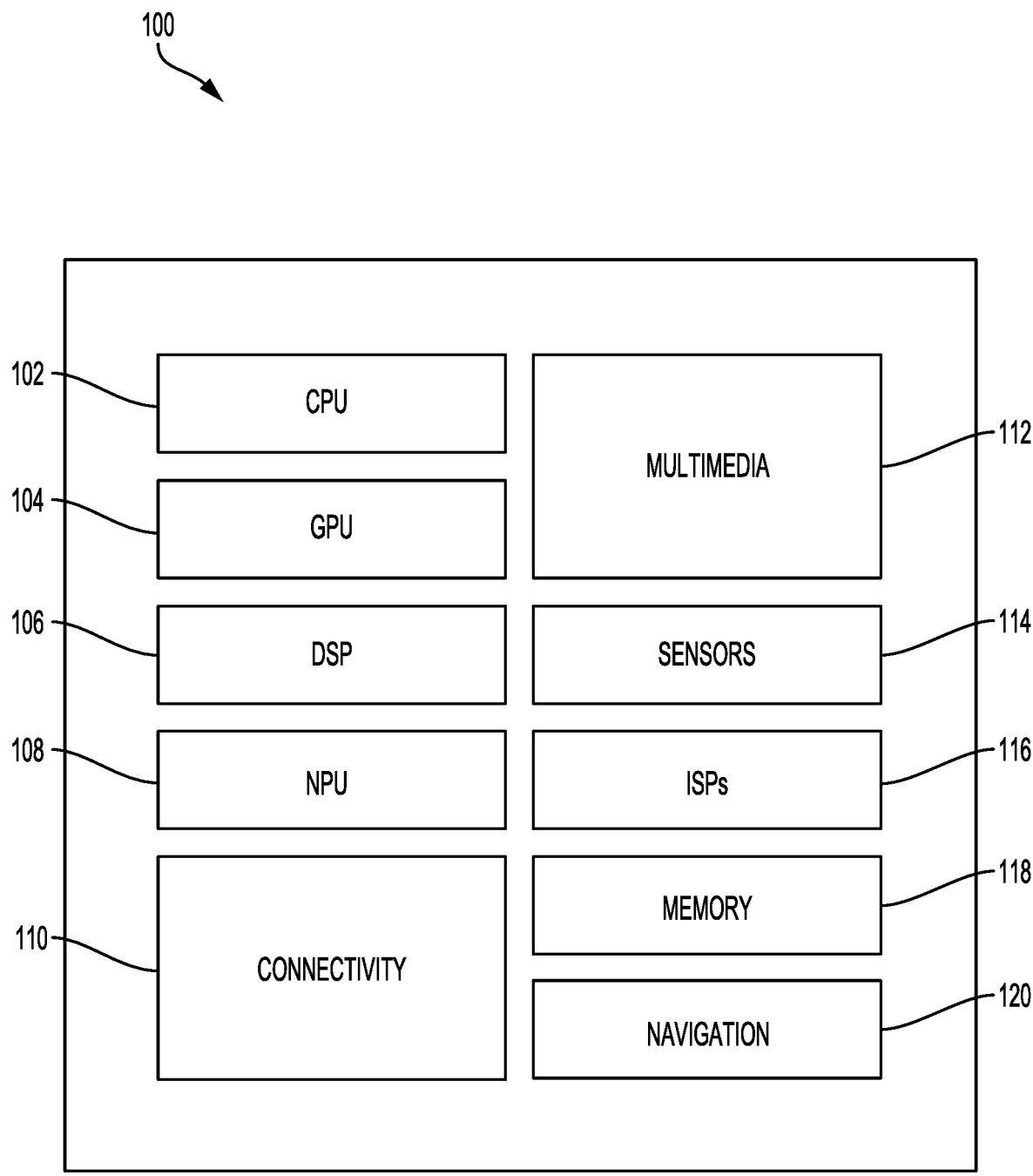
FIG. 1 illustrates an example implementation of a system-on-chip (SoC), including a back-end-of-line (BEOL) on-chip sensor, in accordance with certain aspects of the present disclosure.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent, however, to those skilled in the art that these concepts may be practiced without these specific details. In some instances, well-known structures and components are shown in block diagram form in order to avoid obscuring such concepts.

As described herein, the use of the term "and/or" is intended to represent an "inclusive OR," and the use of the term "or" is intended to represent an "exclusive OR." As described herein, the term "exemplary" used throughout this description means "serving as an example, instance, or illustration," and should not necessarily be construed as preferred or advantageous over other exemplary configurations. As described herein, the term "coupled" used throughout this description means "connected, whether directly or indirectly through intervening connections (e.g., a switch), electrical, mechanical, or otherwise," and is not necessarily limited to physical connections. Additionally, the connections can be such that the objects are permanently connected or releasably connected. The connections can be through switches. As described herein, the term "proximate" used throughout this description means "adjacent, very near, next to, or close to." As described herein, the term "on" used throughout this description means "directly on" in some configurations, and "indirectly on" in other configurations.

A system hierarchy includes interconnection of active devices at a lowest system level all the way up to system level interconnections at a highest level. Electrical connections exist at each of the levels of the system hierarchy to connect different devices together on an integrated circuit. As integrated circuits become more complex, however, more interconnect layers are used to provide the electrical connections between the devices. More recently, the number of interconnect levels for circuitry has substantially increased due to the large number of devices that are now interconnected in a modern electronic device.

An increased number of interconnect levels for supporting an increased number of devices involves more intricate processes. For example, the design of complex complementary metal oxide semiconductor (CMOS) system-on-chips (SoCs) may be affected by layer-to-layer interconnect variation. Unfortunately, current on-chip sensors (e.g., minimum voltage (Vmin) tracking) are sensitive mostly to front-end-of-line (FEOL) variations. These sensors are not sensitive to BEOL layer-to-layer variations. Consequently, conventional SoC designers are forced to add additional voltage margin to compensate for BEOL layer-to-layer variations that are not detected by current sensors. That is, a dynamic performance of complex CMOS SoCs is detrimentally affected by layer-to-layer interconnect variation. CMOS SoC circuit design techniques that account for layer-to-layer interconnect variation, such as layer-to-layer variation between back-end-of-line (BEOL) interconnect layers, are desired.

As described, back-end-of-line (BEOL) interconnect layers may refer to the conductive interconnect layers (e.g., a first BEOL interconnect layer (M1) or metal one M1, metal two (M2), metal three (M3), metal four (M4), etc.) for electrically coupling to front-end-of-line active devices of an integrated circuit. The various back-end-of-line interconnect layers are formed at corresponding back-end-of-line interconnect levels, in which lower back-end-of-line interconnect levels use thinner metal layers relative to upper back-end-of-line interconnect levels. The back-end-of-line interconnect layers may electrically couple to middle-of-line interconnect layers, for example, to connect M1 to an oxide diffusion (OD) layer of an integrated circuit. The middle-of-line interconnect layer may include a zero interconnect layer (M0) for connecting M1 to an active device layer of an integrated circuit. A back-end-of-line first via (V2) may connect M2 to M3 or others of the back-end-of-line interconnect layers.

Various aspects of the disclosure provide a back-end-of-line (BEOL) on-chip sensor. The process flow for fabrication of the BEOL on-chip sensor may include front-end-of-line (FEOL) processes, middle-of-line (MOL) processes, and back-end-of-line (BEOL) processes. It will be understood that the term "layer" includes film and is not construed as indicating a vertical or horizontal thickness unless otherwise stated. As described, the term "substrate" may refer to a substrate of a diced wafer or may refer to a substrate of a wafer that is not diced. Similarly, the terms chip and die may be used interchangeably.

Aspects of the present disclosure describe a back-end-of-line (BEOL) on-chip sensor to detect layer-to-layer variation between BEOL interconnect layers. For example, an integrated circuit (IC) includes a substrate and BEOL layers on the substrate. In one configuration, the IC includes a sensor in a BEOL layer (Mx) of the BEOL layers. The BEOL sensor includes X conductive traces and X+1 shield traces within the BEOL layer Mx, which may be referred to as a layer under test. In one configuration, the X+1 shield traces are interdigitated with the X conductive traces in the BEOL layer Mx. In this configuration, the BEOL sensor also includes a first ground shield in a BEOL layer Mx−1, and a second ground shield in a BEOL layer Mx+1. In accordance with aspects of the present disclosure, the BEOL sensor includes logic configured to ground/float the X+1 shield traces. This operation causes the interdigitated shield traces to make a load more capacitive or more resistive.

According to aspects of the present disclosure, a BEOL sensor combines a variable wire-loaded ring oscillator with an unloaded ring oscillator to decouple front-end-of-line (FEOL) and middle-of-line (MOL) noise from BEOL interconnect variation. In aspects of the present disclosure, a frequency ratio is determined between a variable wire-loaded ring oscillator measurement and an unloaded ring oscillator measurement. The ratios may be computed when the variable wire-loaded ring oscillator is in a floating state configuration versus a ground state configuration of the variable wire-loaded ring oscillator.

FIG. 1 illustrates an example implementation of a host system-on-chip (SoC) 100, which includes a back-end-of-line (BEOL) on-chip sensor, in accordance with aspects of the present disclosure. The host SoC 100 includes processing blocks tailored to specific functions, such as a connectivity block 110. The connectivity block 110 may include fifth generation (5G) connectivity, fourth generation long term evolution (4G LTE) connectivity, Wi-Fi connectivity, USB connectivity, Bluetooth® connectivity, Secure Digital (SD) connectivity, and the like.

In this configuration, the host SoC 100 includes various processing units that support multi-threaded operation. For the configuration shown in FIG. 1, the host SoC 100 includes a multi-core central processing unit (CPU) 102, a graphics processor unit (GPU) 104, a digital signal processor (DSP) 106, and a neural processor unit (NPU) 108. The host SoC 100 may also include a sensor processor 114, image signal processors (ISPs) 116, a navigation module 120, which may include a global positioning system, and a memory 118. The multi-core CPU 102, the GPU 104, the DSP 106, the NPU 108, and the multimedia engine 112 support various functions such as video, audio, graphics, gaming, artificial networks, and the like. Each processor core of the multi-core CPU 102 may be a reduced instruction set computing (RISC) machine, an advanced RISC machine (ARM), a microprocessor, or some other type of processor. The NPU 108 may be based on an ARM instruction set.

Figure 2:
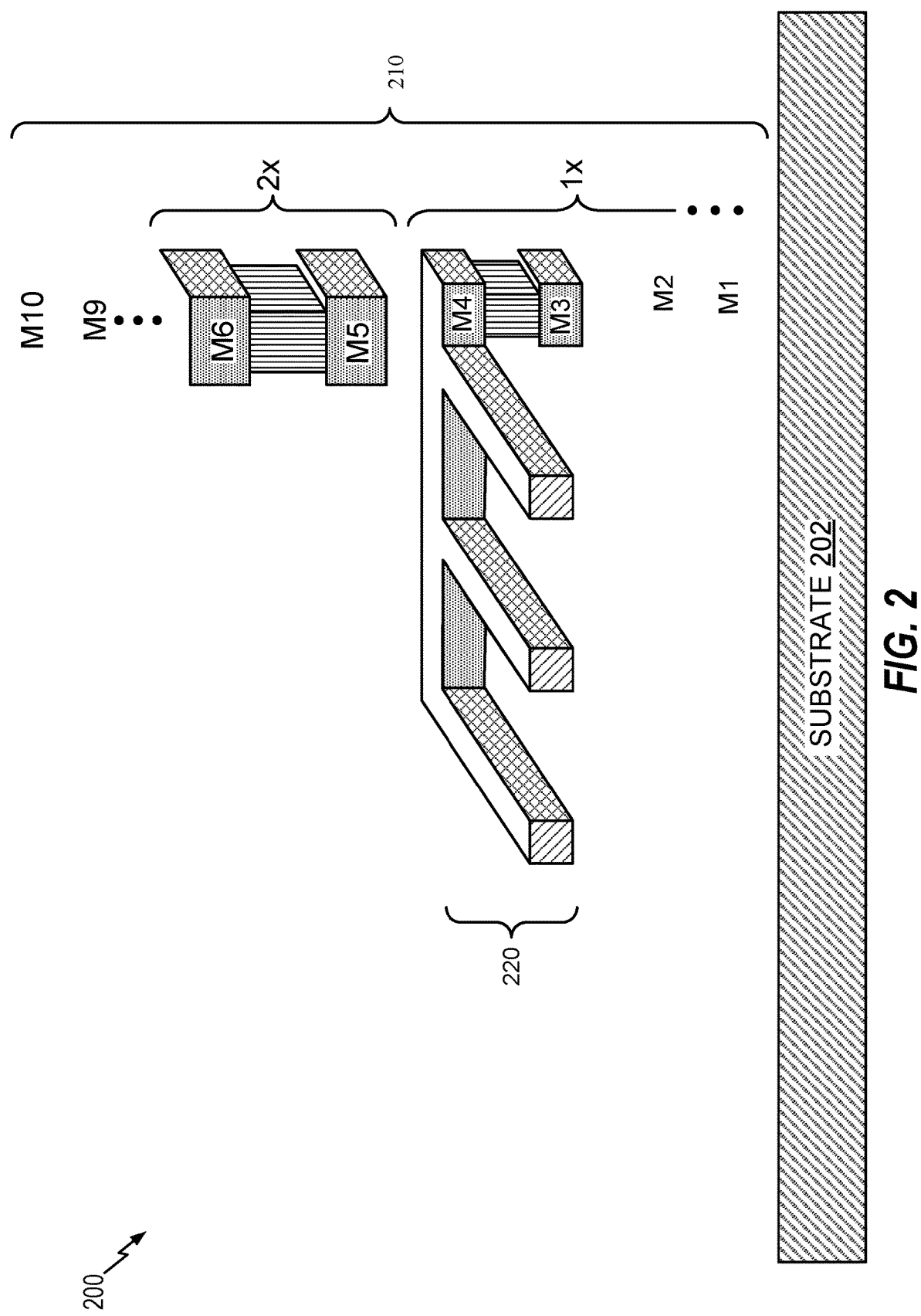
FIG. 2 is a cross-section illustrating an integrated circuit (IC) device including an interconnect stack of back-end-of-line (BEOL) layers.

FIG. 2 is a block diagram illustrating a cross-section of an integrated circuit (IC) device 200 including an interconnect stack 210. The interconnect stack 210 of the IC device 200 includes multiple BEOL conductive interconnect layers (M1, . . . , M9, M10) on a semiconductor substrate 202 (e.g., a diced silicon wafer). The semiconductor substrate 202 may be fabricated to include an active device layer (not shown) using complementary metal oxide semiconductor (CMOS) technology. The various back-end-of-line interconnect layers are formed at corresponding back-end-of-line interconnect levels, in which lower back-end-of-line interconnect levels (e.g., M1) use thinner metals layers relative to upper (e.g., M9) back-end-of-line interconnect levels. In this example, an interconnect structure 220 is formed at an M4 interconnect layer, between M3 and M5 interconnect layers.

Figure 3:
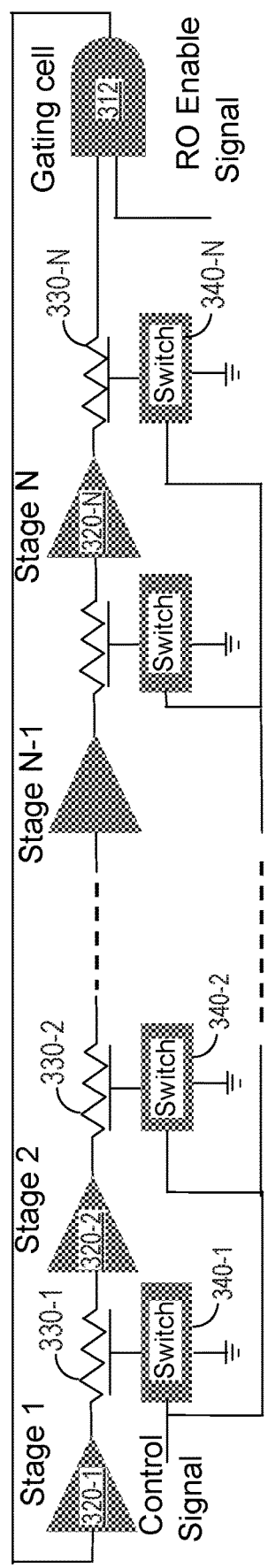
FIG. 3 is a diagram illustrating a back-end-of-line (BEOL) on-chip sensor, according to aspects of the present disclosure.
Figure 3:
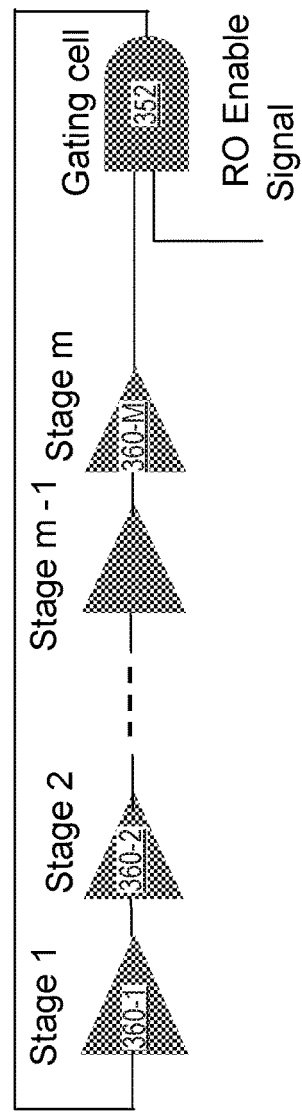

According to aspects of the present disclosure, a BEOL on-chip sensor may be formed within the M1 to M3 interconnect levels using BEOL conductive interconnect layers M1 to M3, for example, as shown in FIG. 3. Although described with reference to the M1 to M3 interconnect levels, it should be recognized that the on-chip sensor may be formed in other interconnect levels of the interconnect stack 210.

FIG. 3 is a schematic diagram illustrating a BEOL on-chip sensor, according to aspects of the present disclosure. In this aspect of the present disclosure, a BEOL on-chip sensor 300 includes an N-stage variable wire-loaded ring oscillator (RO) 310 and an M-stage unloaded reference RO 350. In one configuration, the variable wire-loaded RO 310 includes a first driver 320-1 (e.g., a first inverter), a second driver 320-2 (e.g., a second inverter), and an Nth driver 320-N (e.g., an Nth inverter). In this configuration, the first driver 320-1 is coupled to a first variable load 330-1, and the second driver 320-2 is coupled to a second variable load 330-2, and the Nth driver 320-N is coupled to an Nth variable load 330-N. In addition, the first variable load 330-1 is controlled by a first switch 340-1, the second variable load 330-2 is controlled by a second switch 340-2, and the Nth variable load 330-N is controlled by an Nth switch 340-N. The variable wire-loaded RO 310 is activated/deactivated by a gating cell 312 in response to an RO enable signal.

The unloaded reference RO 350 includes a first driver 360-1 directly coupled to a second driver 360-2, and multiple driver stages completing in an Mth stage driver 306-M. The unloaded reference RO 350 is activated/deactivated by a gating cell 352 in response to an RO enable signal. In this aspects of the present disclosure, the unloaded reference RO 350 includes forty-eight stages (e.g., M=48), and the variable wire-loaded RO 310 includes twelve stages (e.g., M=12). Although specific details on the number of RO stages are provided, it should be recognized that any number of stages may be used as along as the RO is oscillating. The first variable load 330-1 and the second variable load 330-2, . . . , and the Nth variable load 330-N may be designed as shown in the layout view of FIG. 4.

Figure 4:
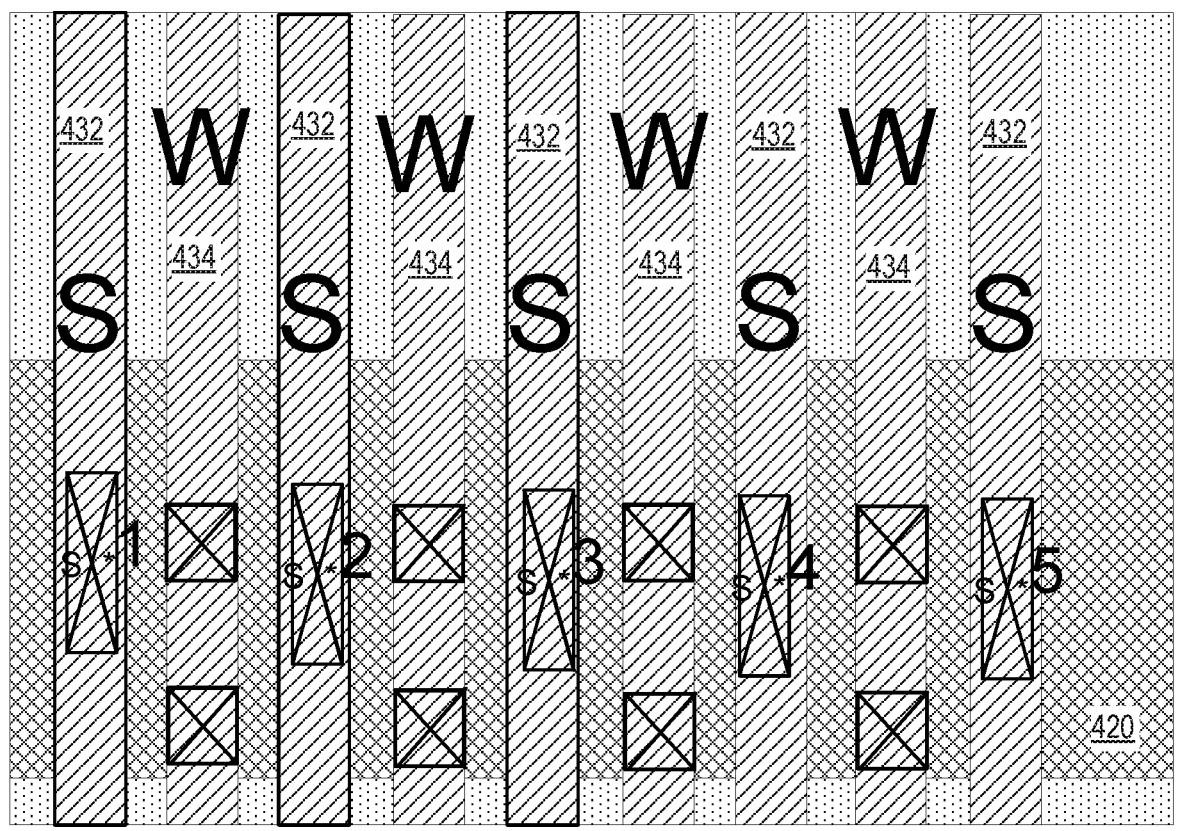
FIG. 4 is a layout diagram illustrating a back-end-of-line (BEOL) on-chip sensor, according to aspects of the present disclosure.

FIG. 4 is a layout diagram illustrating a variable load of a BEOL on-chip sensor, according to aspects of the present disclosure. In this configuration, a variable load 400 of the BEOL on-chip sensor 300 is shown in a layout view. In this configuration, the variable load 400 includes shield traces (S) 432 interdigitated with conductive traces (W) 434 in a BEOL layer Mx (e.g., metal two (M2)). The traces may be minimum width and minimum pitch. The variable load 400 also includes a first ground shield 420, which may be formed in a BEOL layer Mx+1/Mx−1, and a second ground shield (not shown). A cross-section view of the variable load 400 is shown in FIGS. 5A and 5B.

Figure 5A:
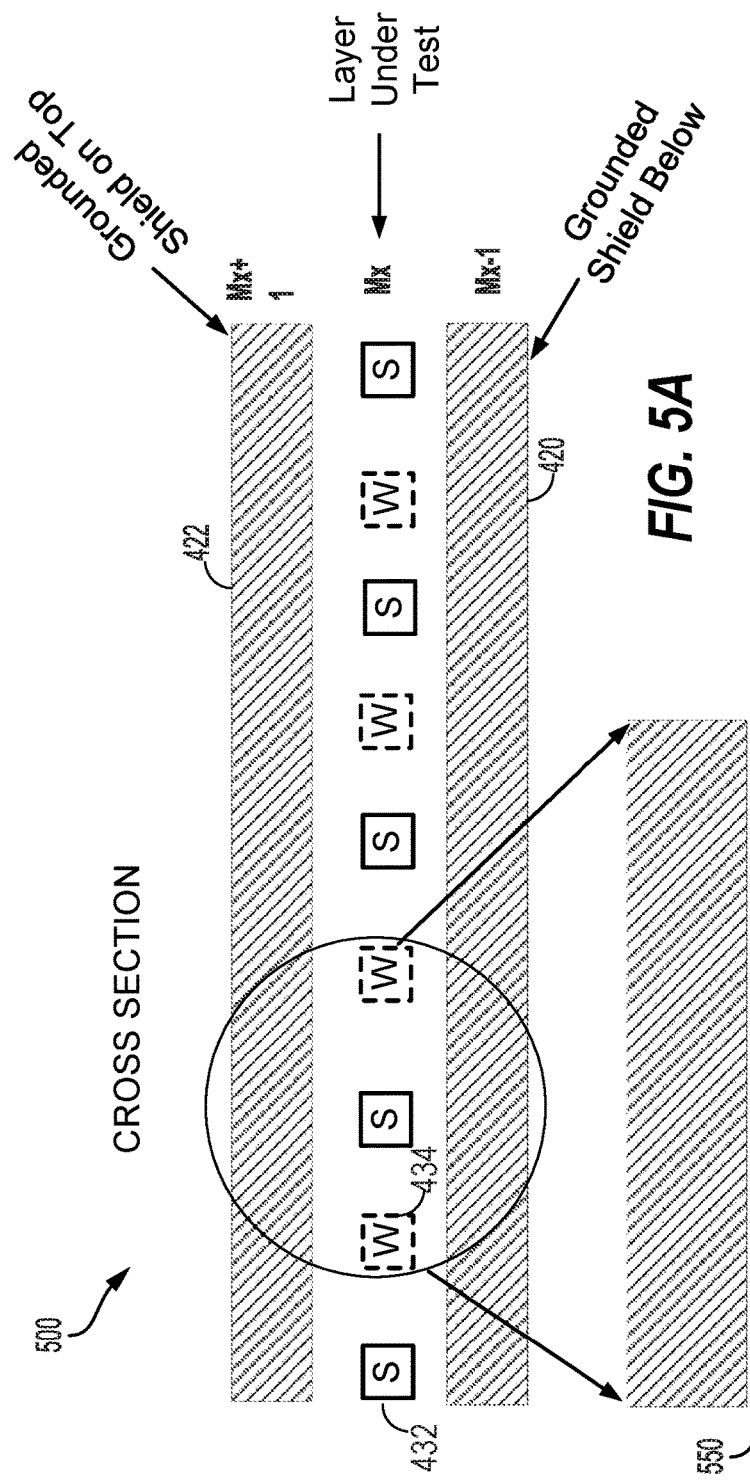
FIGS. 5A and 5B are cross-sections illustrating a back-end-of-line (BEOL) on-chip sensor, according to aspects of the present disclosure.
Figure 5B:
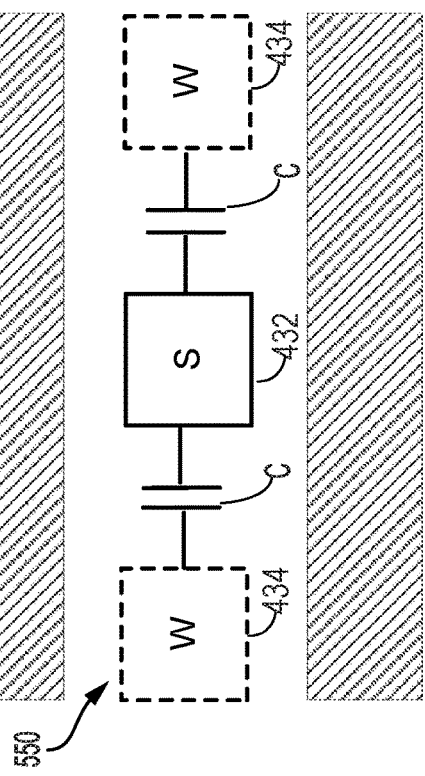

FIGS. 5A and 5B are cross-sections illustrating the variable load 400 of FIG. 4 of the BEOL on-chip sensor 300 of FIG. 3, according to aspects of the present disclosure. In this configuration, the variable load 400 is shown in a cross-section view 500, including the shield traces S 432 interdigitated with the conductive traces W 434 in the BEOL layer Mx (e.g., metal two (M2)). In this configuration, the first ground shield 420 is formed in the BEOL layer Mx−1 (e.g., metal one (M1)), and a second ground shield 422 is formed in the BEOL layer Mx+1 (e.g., metal three (M3)).

FIG. 5B shows a blow-up 550 of the cross-section view 500 of the variable load 400 of the BEOL on-chip sensor 300 shown in FIG. 3, according to aspects of the present disclosure. In this configuration, the variable load 400 is controlled through grounding/floating of the interdigitated shield traces S 432, which makes the variable load 400 more capacitive or resistive. For example, the blow-up 550 of the cross-section view 500 illustrates a coupling capacitance C between the shield traces S 432 and the conductive trace W 434. In operation, when the shield traces S 432 are grounded, the coupling capacitance C increases, causing a driver (e.g., inverter) to see a more capacitive load. By contrast, when the shield traces S 432 are floated, the coupling capacitance C significantly reduces, causing the driver (e.g., inverter) to see a more resistive load.

Figure 6:
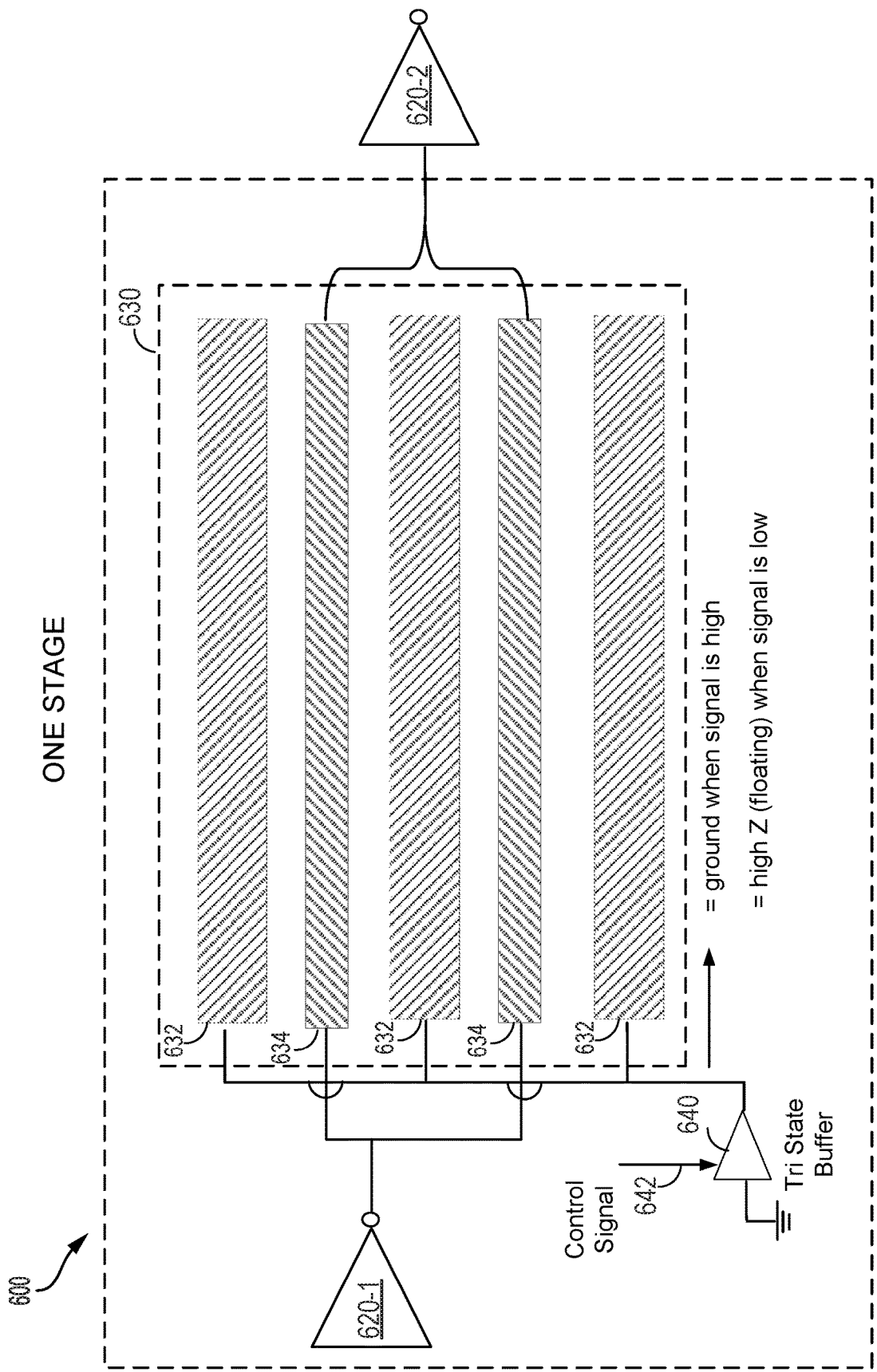
FIG. 6 is a schematic diagram illustrating a back-end-of-line (BEOL) on-chip sensor, according to aspects of the present disclosure.

FIG. 6 is a schematic diagram illustrating a BEOL on-chip sensor, according to aspects of the present disclosure. Although this configuration illustrates one stage of a BEOL on-chip sensor 600, it should be recognized that the structure of the BEOL on-chip sensor 600 may be large in order to capture wire variation effects. The BEOL on-chip sensor 600 may be arranged on multiple BEOL layers, including multiple stages of the BEOL on-chip sensor 600.

As shown in FIG. 6, the BEOL on-chip sensor 600 may be implemented with a variable wire-loaded ring oscillator (RO), such as the variable wire-loaded RO 310, as shown in FIG. 3. In one configuration, the BEOL on-chip sensor 600 includes a first driver 620-1 (e.g., a first inverter) coupled to a second driver 620-2 (e.g., a second inverter) through conductive traces (W) 634 of a variable load 630. In this configuration, shield traces (S) 632 of the variable load 630 are coupled to a tristate buffer 640. In this configuration, the variable load 630 is controlled by the tristate buffer 640. In operation, the tristate buffer 640 grounds the shield traces S 632 of the variable load 630 when a control signal 642 is high. By contrast, the tristate buffer 640 floats the shield traces S 632 (e.g., a high impedance (Z) state) of the variable load 630 when the control signal 642 is low.

Figure 7:
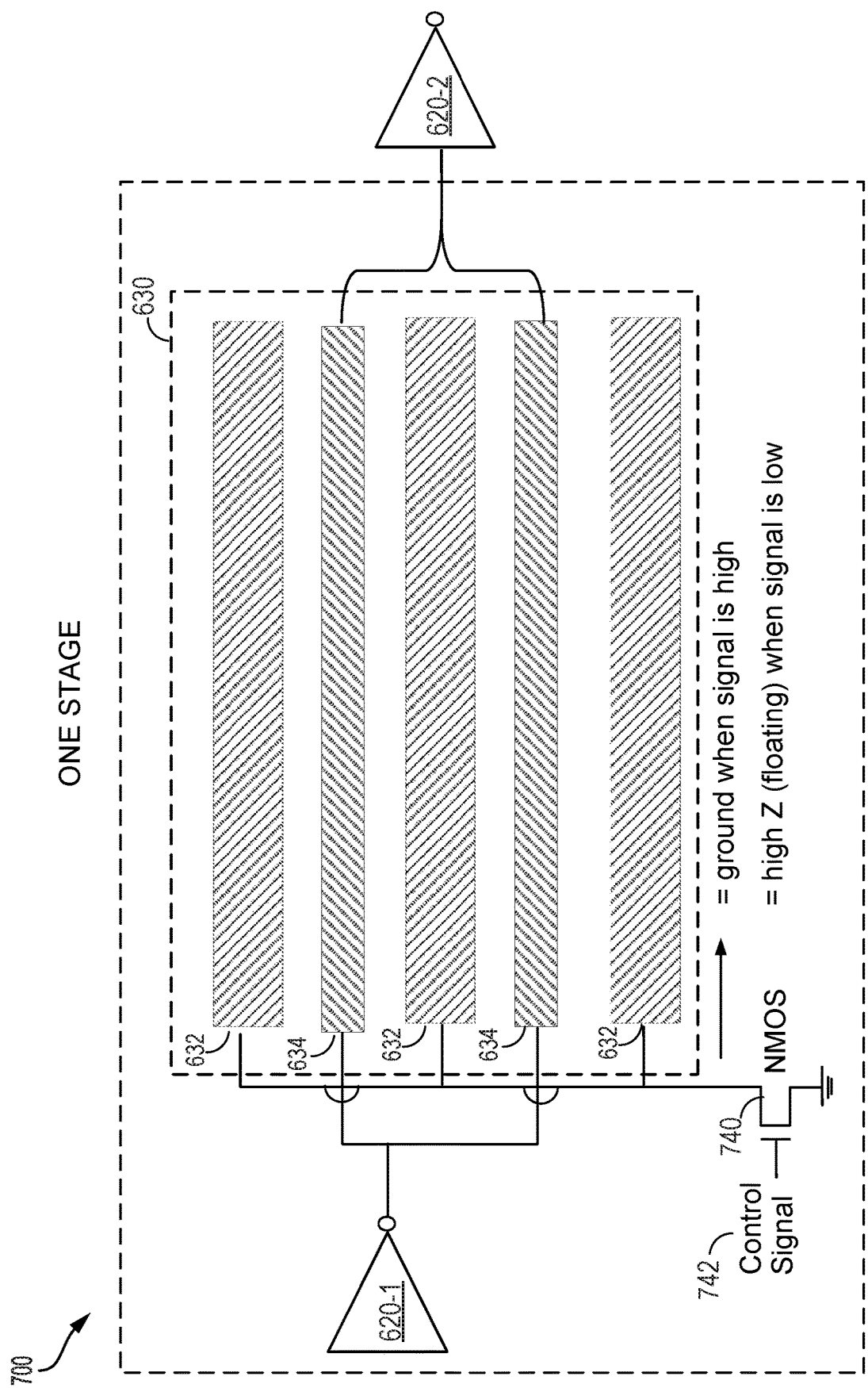
FIG. 7 is a schematic diagram illustrating a back-end-of-line (BEOL) on-chip sensor, according to a further aspect of the present disclosure.

FIG. 7 is a schematic diagram illustrating a BEOL on-chip sensor, according to a further aspect of the present disclosure. A BEOL on-chip sensor 700 is implemented in a similar configuration to the BEOL on-chip sensor 600, as shown in FIG. 6. In this configuration, the variable load 630 is controlled by a transistor 740 (e.g., an N-type metal oxide semiconductor (NMOS) transistor). In operation, the transistor 740 grounds the shield traces S 632 of the variable load 630 when a control signal 742 is high. By contrast, the transistor 740 floats the shield traces S 632 (e.g., a high impedance (Z) state) of the variable load 630 when the control signal 742 is low. Although FIGS. 6 and 7 show a single one of the tristate buffer 640 and a single one of the transistor 740, respectively, it should be recognized that additional buffers and transistors may be provided for each stage.

Figure 8:
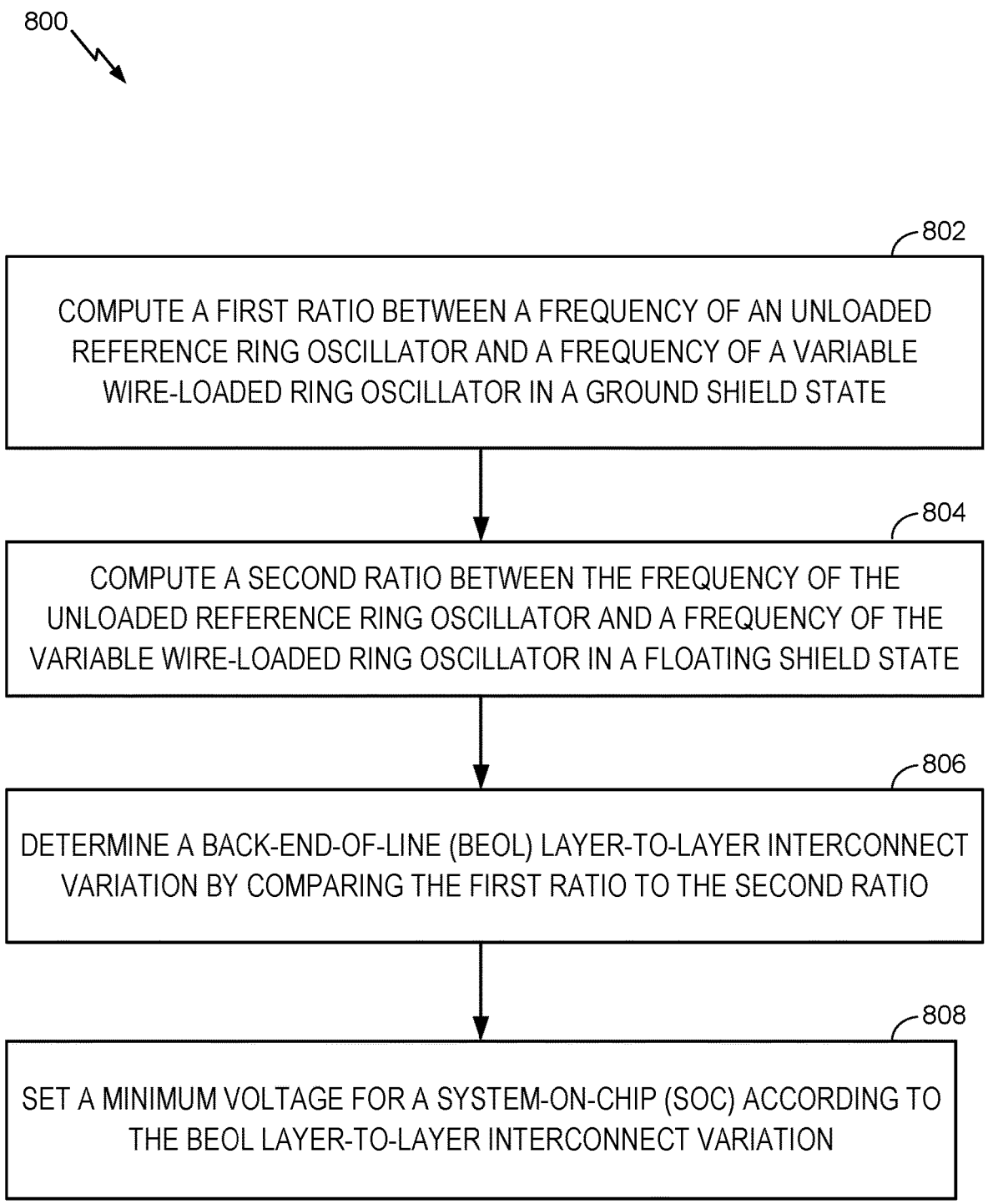
FIG. 8 is a process flow diagram illustrating a method for operating a back-end-of-line (BEOL) on-chip sensor, according to an aspect of the present disclosure.

FIG. 8 is a process flow diagram illustrating a method for operating a back-end-of-line (BEOL) on-chip sensor, according to an aspect of the present disclosure. A method 800 begins in block 802, in which a first ratio is computed between a frequency of an unloaded reference ring oscillator and a frequency of a variable wire-loaded ring oscillator in a ground shield state. For example, as shown in Equation (1):

$$FreqCA_{ratio} = \frac{FreqC_{unloaded}}{FreqA_{loaded}} \qquad (1)$$

As shown in Equation (1) and FIG. 3, a first frequency ratio (e.g., Freq $CA_{ratio}$) is computed between a frequency (e.g., Freq $C_{unloaded}$) of an unloaded reference ring oscillator (e.g., the unloaded reference RO 350) and a frequency (e.g., Freq $A_{loaded}$) of a variable wire-loaded ring oscillator (e.g., the variable wire-loaded RO 310) in a ground shield state. At block 804, a second ratio is computed between the frequency of the unloaded reference ring oscillator and a frequency of the variable wire-loaded ring oscillator in a floating shield state, for example, as shown in Equation (2):

$$FreqCB_{ratio} = \frac{FreqC_{unloaded}}{FreqB_{loaded}} \qquad (2)$$

As shown in Equation (2) and FIG. 3, a second frequency ratio (e.g., Freq $CB_{ratio}$) is computed between the frequency (e.g., Freq $C_{unloaded}$) of the unloaded reference RO 350 and a frequency (e.g., Freq $B_{loaded}$) of the variable wire-loaded RO 310 in a ground shield state. At block 806, a BEOL layer-to-layer interconnect variation is determined by comparing the first ratio Freq $CA_{ratio}$ to the second ratio Freq $CB_{ratio}$. The BEOL layer-to-layer BEOL interconnect variation is determined by decoupling front-end-of-line (FEOL) and middle-of-line (MOL) noise from the measurement of the variable wire-loaded RO 310, as shown in FIG. 3. At block 808, a minimum voltage is set for a system-on-chip (SoC) (e.g., SoC 100) according to the BEOL layer-to-layer interconnect variation.

According to aspects of the present disclosure, a BEOL on-chip sensor provides data for an understanding of the BEOL layer-to-layer interconnect variation in relation to a foundry defined corner or other boundary defined corners. For example, BEOL on-chip sensor data may supplement a dynamic voltage and frequency scaling (DVFS) system. The information from the BEOL sensor may be used in as an additional input to the DVFS system; however, this is not the primary goal of the BEOL sensor.

According to a further aspect of the present disclosure, an IC includes a BEOL on-chip sensor. In one configuration, the IC includes means for supporting back-end-of-line (BEOL) layers. In one configuration, the supporting means may be the semiconductor substrate 202, as shown in FIG. 2. In another aspect, the aforementioned means may be any structure or any material configured to perform the functions recited by the aforementioned means. (Completed after claim language approval).

Figure 9:
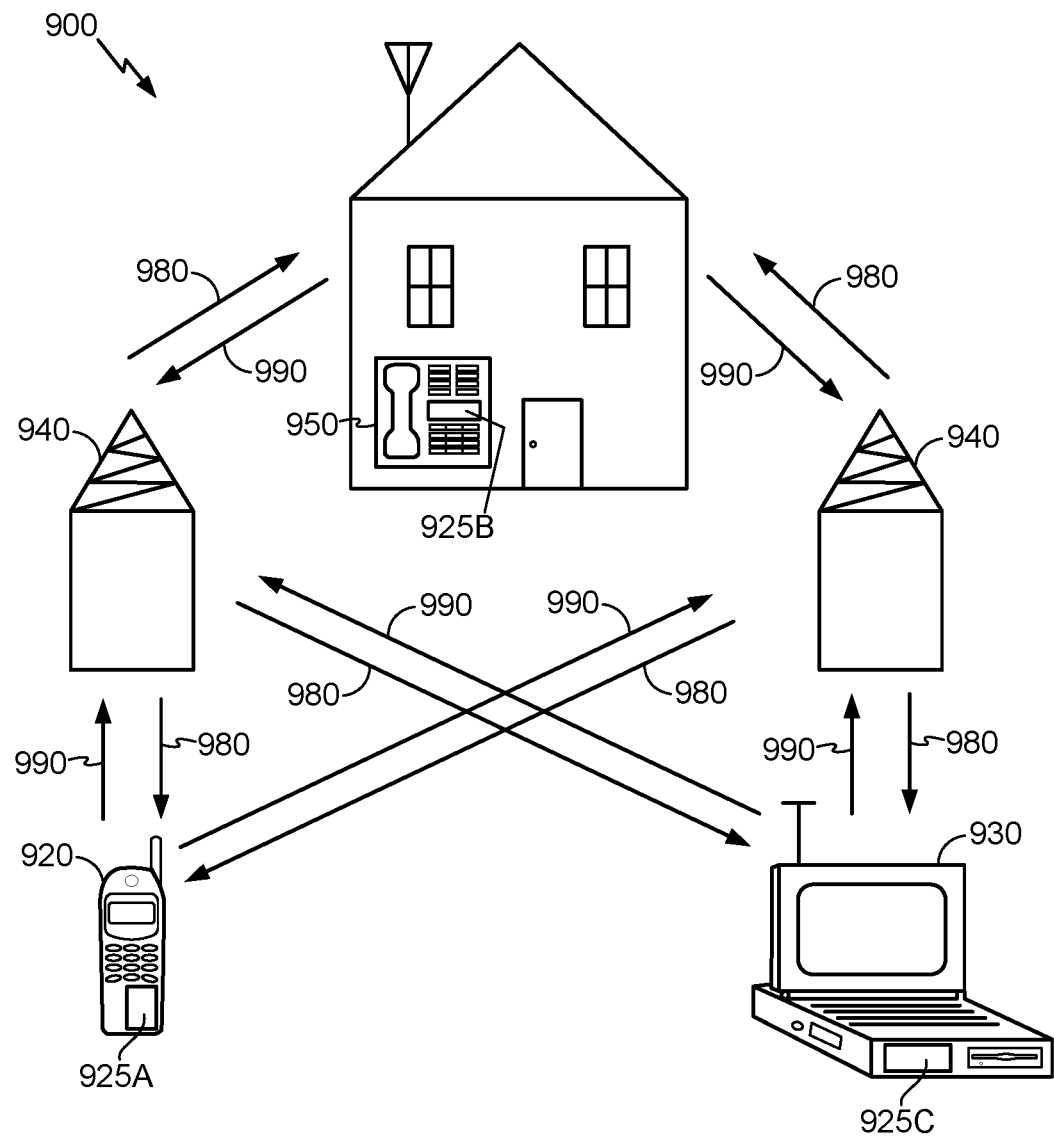
FIG. 9 is a block diagram showing an exemplary wireless communication system in which a configuration of the disclosure may be advantageously employed.

FIG. 9 is a block diagram showing an exemplary wireless communications system 900 in which an aspect of the disclosure may be advantageously employed. For purposes of illustration, FIG. 9 shows three remote units 920, 930, and 950 and two base stations 940. It will be recognized that wireless communications systems may have many more remote units and base stations. Remote units 920, 930, and 950 include IC devices 925A, 925C, and 925B that include the disclosed BEOL on-chip sensor. It will be recognized that other devices may also include the disclosed BEOL on-chip sensor, such as the base stations, switching devices, and network equipment. FIG. 9 shows forward link signals 980 from the base station 940 to the remote units 920, 930, and 950, and reverse link signals 990 from the remote units 920, 930, and 950 to base stations 940.

In FIG. 9, remote unit 920 is shown as a mobile telephone, remote unit 930 is shown as a portable computer, and remote unit 950 is shown as a fixed location remote unit in a wireless local loop system. For example, the remote units may be a mobile phone, a hand-held personal communication systems (PCS) unit, a portable data unit, such as a personal data assistant, a GPS enabled device, a navigation device, a set top box, a music player, a video player, an entertainment unit, a fixed location data unit, such as meter reading equipment, or other device that stores or retrieves data or computer instructions, or combinations thereof. Although FIG. 9 illustrates remote units according to the aspects of the present disclosure, the disclosure is not limited to these exemplary illustrated units. Aspects of the present disclosure may be suitably employed in many devices, which include the disclosed BEOL on-chip sensor.

Figure 10:
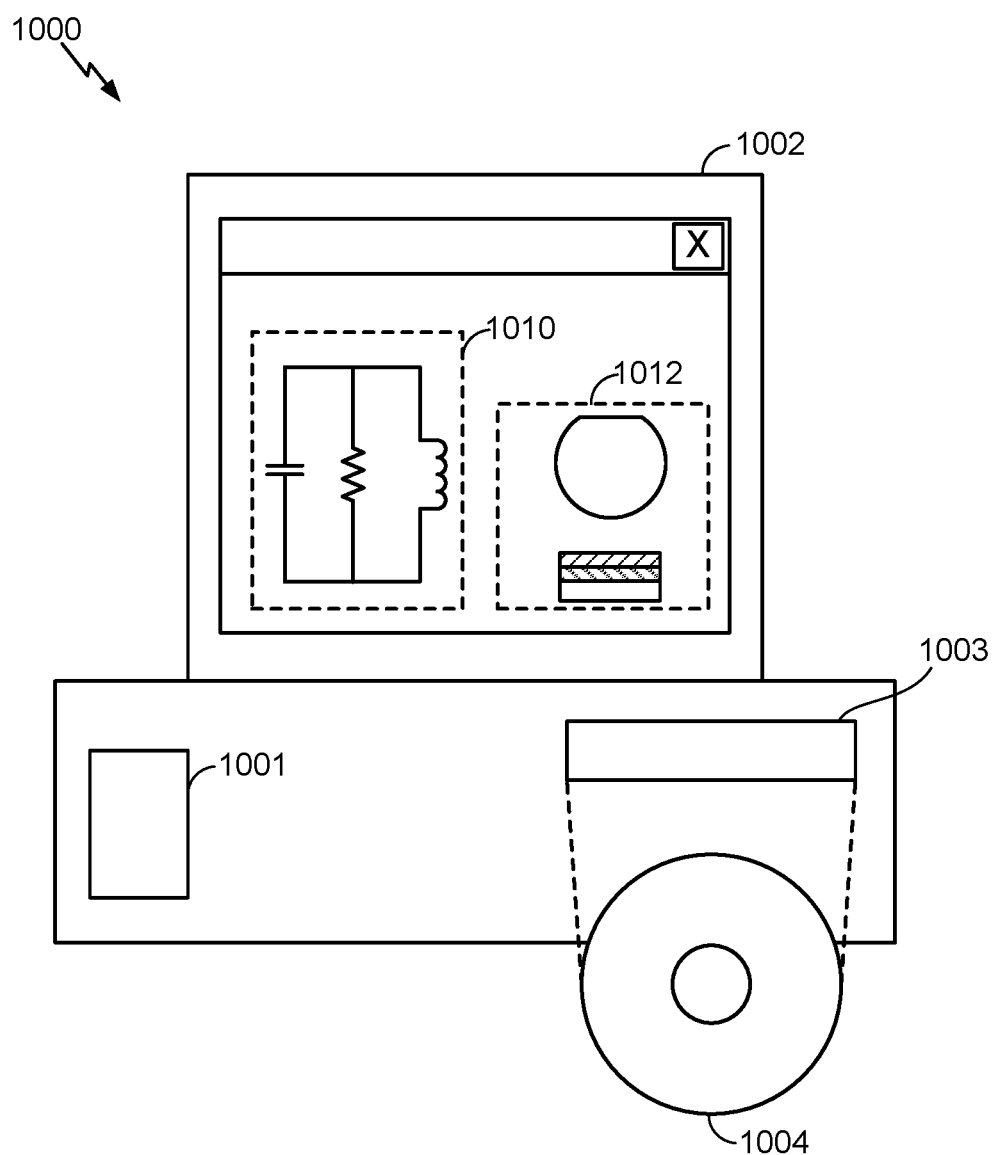
FIG. 10 is a block diagram illustrating a design workstation used for circuit, layout, and logic design of a semiconductor component according to one configuration.

FIG. 10 is a block diagram illustrating a design workstation used for circuit, layout, and logic design of a semiconductor component, such as the capacitors disclosed above. A design workstation 1000 includes a hard disk 1001 containing operating system software, support files, and design software such as Cadence or OrCAD. The design workstation 1000 also includes a display 1002 to facilitate design of a circuit 1010 or an integrated circuit (IC) component 1012 such as a BEOL on-chip sensor. A storage medium 1004 is provided for tangibly storing the design of the circuit 1010 or the IC component 1012 (e.g., the BEOL on-chip sensor). The design of the circuit 1010 or the IC component 1012 may be stored on the storage medium 1004 in a file format such as GDSII or GERBER. The storage medium 1004 may be a CD-ROM, DVD, hard disk, flash memory, or other appropriate device. Furthermore, the design workstation 1000 includes a drive apparatus 1003 for accepting input from or writing output to the storage medium 1004.

Data recorded on the storage medium 1004 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 1004 facilitates the design of the circuit 1010 or the IC component 1012 by decreasing the number of processes for designing semiconductor wafers.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer. Disk and disc, as used herein, include compact disc (CD), laser disc, optical disc, digital versatile disc (DVD), floppy disk and Blu-ray® disc, where disks usually reproduce data magnetically, while discs reproduce data optically with lasers. Combinations of the above should also be included within the scope of computer-readable media.

In addition to storage on computer-readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions, and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

Those of skill would further appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA), or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, multiple microprocessors, one or more microprocessors in conjunction with a DSP core, or any other such configuration.

The steps of a method or algorithm described in connection with the disclosure may be embodied directly in hardware, in a software module executed by a processor, or in a combination of the two. A software module may reside in RAM, flash memory, ROM, EPROM, EEPROM, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can include RAM, ROM, EEPROM, CD-ROM or other optical disk storage, magnetic disk storage or other magnetic storage devices, or any other medium that can be used to carry or store specified program code means in the form of instructions or data structures and that can be accessed by a general-purpose or special-purpose computer, or a general-purpose or special-purpose processor. In addition, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include compact disc (CD), laser disc, optical disc, digital versatile disc (DVD), floppy disk, and Blu-ray® disc, where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. An integrated circuit (IC), comprising:
   a substrate;
   a plurality of back-end-of-line (BEOL) layers on the substrate;
   a sensor in a BEOL layer (Mx) of the plurality of BEOL layers comprising:
   a plurality of conductive traces,
   a plurality of shield traces interdigitated with the plurality of conductive traces in the BEOL layer Mx,
   a first ground shield in a BEOL layer Mx−1, and
   a second ground shield in a BEOL layer Mx+1; and
   logic configured to ground/float the plurality of shield traces.

2. The IC of claim 1, in which the BEOL sensor comprises a variable wire-loaded ring oscillator.

3. The IC of claim 2, in which the variable wire-loaded ring oscillator comprises a first inverter coupled to an input to the plurality of conductive traces, and a second inverter coupled to an output of the plurality of conductive traces.

4. The IC of claim 1, in which the BEOL layer Mx−1 comprises a first BEOL interconnect layer (metal one (M1)).

5. The IC of claim 1, in which the first ground shield and/or the second ground shield is selectively coupled to the plurality of shield traces.

6. The IC of claim 1, in which the logic comprises a tristate buffer.

7. The IC of claim 1, in which the logic comprises an N-type metal oxide semiconductor (NMOS) transistor.

8. The IC of claim 1, further comprising an unloaded ring oscillator.

9. A method for operating a back-end-of-line (BEOL) on-chip sensor, comprising:
   computing a first ratio between a frequency of an unloaded reference ring oscillator and a frequency of a variable wire-loaded ring oscillator in a ground shield state;
   computing a second ratio between the frequency of the unloaded reference ring oscillator and a frequency of the variable wire-loaded ring oscillator in a floating shield state;
   determining a BEOL layer-to-layer interconnect variation by comparing the first ratio to the second ratio; and
   setting a minimum voltage for a system-on-chip (SoC) according to the BEOL layer-to-layer interconnect variation.

10. The method of claim 9, further comprising providing the BEOL layer-to-layer interconnect variation to a dynamic voltage and frequency scaling (DVFS) system.

11. The method of claim 9, in which setting the minimum voltage comprises:
    comparing the BEOL layer-to-layer interconnect variation to a foundry defined corner; and
    computing the minimum voltage for the SoC to compensate for the foundry defined corner.

12. The method of claim 9, further comprising deactivating the BEOL on-chip sensor after testing of the SoC is complete.

13. An integrated circuit (IC), comprising:
    means for supporting a plurality of back-end-of-line (BEOL) layers;
    a sensor in a BEOL layer (Mx) of the plurality of BEOL layers comprising:
    a plurality of conductive traces,
    a plurality of shield traces interdigitated with the plurality of conductive traces in the BEOL layer Mx,
    a first ground shield in a BEOL layer Mx−1, and
    a second ground shield in a BEOL layer Mx+1; and
    logic configured to ground/float the plurality of shield traces.

14. The IC of claim 13, in which the BEOL sensor comprises a variable wire-loaded ring oscillator.

15. The IC of claim 14, in which the variable wire-loaded ring oscillator comprises a first inverter coupled to an input to the plurality of conductive traces, and a second inverter coupled to an output of the plurality of conductive traces.

16. The IC of claim 13, in which the BEOL layer Mx−1 comprises a first BEOL interconnect layer (metal one (M1)).

17. The IC of claim 13, in which the first ground shield and/or the second ground shield is selectively coupled to the plurality of shield traces.

18. The IC of claim 13, in which the logic comprises a tristate buffer.

19. The IC of claim 13, in which the logic comprises an N-type metal oxide semiconductor (NMOS) transistor.

20. The IC of claim 13, further comprising an unloaded ring oscillator.

* * * * *